United States Patent
Mehrotra et al.

(10) Patent No.: US 6,467,069 B2
(45) Date of Patent: Oct. 15, 2002

(54) TIMING CLOSURE AND NOISE AVOIDANCE IN DETAILED ROUTING

(75) Inventors: Sharad Mehrotra; Parsotam Trikam Patel, both of Austin, TX (US)

(73) Assignee: International Business Machines Corporation, Armonk, NY (US)

(*) Notice: Subject to any disclaimer, the term of this patent is extended or adjusted under 35 U.S.C. 154(b) by 111 days.

(21) Appl. No.: 09/737,333

(22) Filed: Dec. 15, 2000

(65) Prior Publication Data

US 2002/0078425 A1 Jun. 20, 2002

(51) Int. Cl.[7] .................................................. G06F 17/50
(52) U.S. Cl. ................................. 716/6; 716/12; 716/8
(58) Field of Search ...................................... 716/1–21

(56) References Cited

U.S. PATENT DOCUMENTS

| | | | | |
|---|---|---|---|---|
| 5,610,833 A | * | 3/1997 | Chang et al. | 716/11 |
| 5,706,206 A | * | 1/1998 | Hammer et al. | 716/4 |
| 5,828,580 A | * | 10/1998 | Ho | 716/12 |
| 5,903,469 A | * | 5/1999 | Ho | 716/5 |
| 5,999,726 A | * | 12/1999 | Ho | 716/11 |
| 6,061,508 A | * | 5/2000 | Mehrotra et al. | 716/6 |
| 6,128,768 A | * | 10/2000 | Ho | 716/5 |
| 6,185,722 B1 | * | 2/2001 | Darden et al. | 716/5 |
| 6,240,375 B1 | * | 5/2001 | Sonoda | 703/14 |
| 6,282,692 B1 | * | 8/2001 | Rubin | 716/4 |
| 6,360,350 B1 | * | 3/2002 | Gabele et al. | 716/1 |
| 6,374,391 B1 | * | 4/2002 | Yamada | 716/5 |

OTHER PUBLICATIONS

Ferreira et al., "Fast interconnect parasitic extraction in deep submicron using bin–based algorithm", Proceeding of 43rd IEEE Midwest Symposium on Circuits and Systems, Aug. 8, 2000, vol. 3, pp. 1148–1151.*

Chang et al., "HIVE: an efficient interconnect capacitance extractor to support submicron multilevel interconnect designs", 1991 IEEE International Conference on Computer–Aided Design, Nov. 11, 1991, pp. 294–297.*

NN9512237, "Method for Modeling the Skin Effect in Inductance Calculation Programs", IBM Technical Disclosure Bulletin, vol. 38, No. 12, Dec. 1, 1995, pp. 237–240 (5 pages).*

Hong et al., "A Novel Dimension–Reduction Technique for the Capacitance Extraction of 3–D VLSI Interconnects", IEEE Transactions on Microwave Theory and Techniques, vol. 46, No. 8, Aug. 1998, pp. 1037–1044.*

Hong et al., "A Novel Dimension Reduction Technique for the Capacitance Extraction of 3D VLSI Interconnects", 1996 IEEE/ACM International Conference on Computer–Aided Design, Nov. 10, 1996, pp. 381–386.*

(List continued on next page.)

Primary Examiner—Matthew Smith
Assistant Examiner—Phallaka Kik
(74) Attorney, Agent, or Firm—Duke W. Yee; Robert M. Carwell; Christopher P. O'ttagan

(57) ABSTRACT

A method for timing and noise analysis in designing data processing chips is provided. The process begins by wiring all unconnected nets in the design and then using a 2½ D capacitance extraction technique built into a detailed router to extract all of the wired nets. The data from the extracted nets is then process using a timing and analysis tool. Optimization programs are then used to generate fixes for any nets in the design which contribute to timing and noise failures. The present invention gives designers the capability of fast and accurate interconnect extraction within the routing tool. In addition, this technique is incremental. Any wiring changes can be quickly re-extracted, since only local information is required for extraction. This incremental capability allows designers to perform quick iterations of wiring, extraction and timing analysis.

21 Claims, 2 Drawing Sheets

OTHER PUBLICATIONS

Arora et al., "Modeling and Extraction of Interconnect Capacitances for Multilayer VLSI Circuits" IEEE Transactions on Computer Aided–Design of Integrated Circuits and Systems, vol. 15, No. 1, Jan. 1996, pp. 58–67.*

Lefevre et al., "A 2D Finite Element Formulation for the Study of the High Frequency Behaviour of Wound Components", IEEE Transactions on Magnetics, vol. 32, No. 3, May 1996, pp. 1098–1101.*

Zemanian et al., "Exterior Templates for Capacitance Computations", IEEE Transactions on Computer–Aided Design of Integrated Circuits and Systems, vol. 18, No. 2, Feb. 1999, pp. 248–251.*

Zhang et al., "Contributions of Corner Singularities of the Capacitance of Interconnections Wires", 1995 IEEE International Symposium on Circuits and Systems, vol. 2, Apr. 28, 1995, pp. 1420–1423.*

Chang et al., "Parameterized SPICE Subcircuits Multilevel Interconnect Modeling", 1992 Symposium on VLSI Technology, Jun. 2, 1992, pp. 78–79.*

Chang et al., "HIVE: an Express and Accurate Interconnect Capacitance Extractor for Submicron Mutlivel Conductor Systems", IEEE Proceedings of the Eigth International VLSI Interconnection Conference, Jun. 11, 1991, pp. 359–363.*

* cited by examiner

US 6,467,069 B2

TIMING CLOSURE AND NOISE AVOIDANCE IN DETAILED ROUTING

BACKGROUND OF THE INVENTION

1. Technical Field

The present invention relates to evaluating the performance of data processing systems. More specifically, the present invention relates to the design of high-performance processing chips.

2. Description of Related Art

Timing closure in designing high-performance Very Large Scale Integration (VLSI) chips in current and next generation process technologies is a complex task. It entails carefully iterating between logic design (through choosing correct power levels for circuits and buffering long wires), physical design (placement and routing), layout extraction (to compute interconnect delays and circuit loadings) and timing analysis (to compute path delays and identify cycle-time limiting paths). Timing analysis actually permeates throughout this iteration.

A crucial step in timing analysis is evaluating the effect of interconnect wiring on path delays, because interconnect effects can comprise as much as 70% of the path delay. Before full layout is available, the interconnect is usually estimated by constructing Steiner routes (which ignore blockages from circuits and other nets) to each segment of the estimated network. After full layout, this same information is obtained from extraction of resistance and capacitance values from interconnect geometries.

The inaccuracy of the Steiner tree networks and the default electrical characteristics leads to expensive design iterations. Typically, after a first full physical design is obtained, the timing analysis with extracted data will report numerous failures (paths violating cycle-time). To correct these failures, a new logic design is performed (i.e. logic repartitioned, buffers added), and timing analysis is performed with the previously extracted interconnect data to account for interconnect effects. However, by the time this logic design is completed, the interconnect data is obsolete. This results from the fact that the logic changes require a new physical design which might change the interconnect significantly. Hence, a new physical design and extraction is required. This leads to serious loss of productivity. The new physical design requires completely legalizing the placement, obtaining a routing with minimum overflows, and a full layout extraction. This activity can take days for a large design.

Therefore, it would be desirable to have a method to achieve chip design closure in a timely manner by reducing the number of costly iterations of full-chip routing, extraction, and timing and noise analysis.

SUMMARY OF THE INVENTION

The present invention provides a method for timing and noise analysis in designing data processing chips. The process begins by wiring all unconnected nets in the design and then using a 2½ D capacitance extraction technique built into a detailed router to extract all of the wired nets. The data from the extracted nets is then processed using a timing and analysis tool. Optimization programs are then used to generate fixes for any nets in the design which contribute to timing and noise failures.

The present invention gives designers the capability of fast and accurate interconnect extraction within the routing tool. In addition, this technique is incremental. Any wiring changes can be quickly re-extracted, since only local information is required for extraction. This incremental capability allows designers to perform quick iterations of wiring, extraction and timing analysis.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
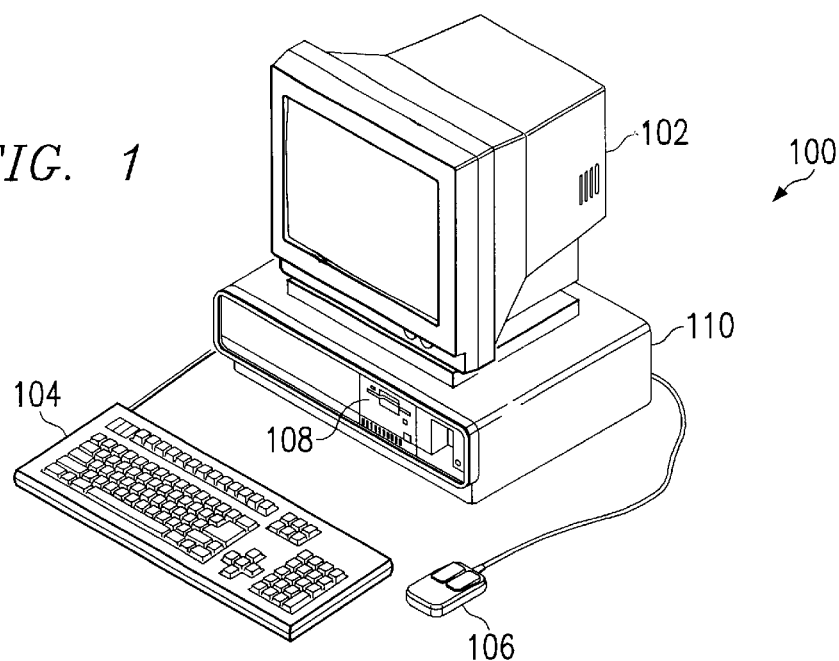
FIG. 1 depicts a pictorial representation of a data processing system in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
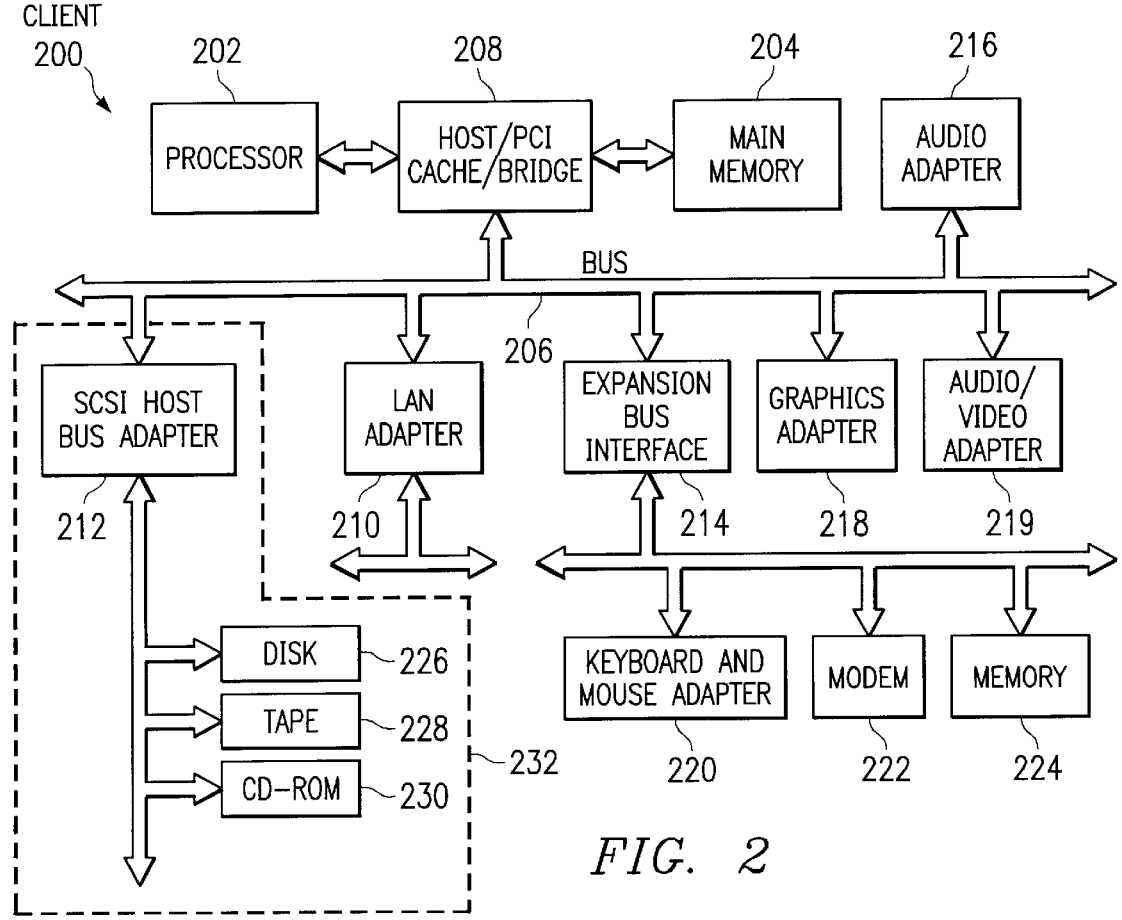
FIG. 2 depicts a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards.

In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives-and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Timing closure in designing high-performance Very Large Scale Integration (VLSI) chips in current and next generation process technologies is a complex task. It entails carefully iterating between logic design (through choosing correct power levels for circuits and buffering long wires), physical design (placement and routing), layout extraction (to compute interconnect delays and circuit loadings) and timing analysis (to compute path delays and identify cycle-time limiting paths).

The present invention provides a method for eliminating the need for expensive design iterations by employing flat wiring of the entire chip and an accurate 2½ D capacitance extraction technique based on detailed wiring. This technique allows quick extraction of self and coupling capacitances for any net in the design. By feeding this extracted data to the timing analysis tool, fast timing feedback can be achieved. This allows the designer to perform various wire optimizations, embed the wire, extract it and analyze its effect on timing. Similarly, the accurate coupling extraction allows the designer to perform detailed noise analysis on any net in the design, and evaluate the effect of various noise avoidance techniques directly in routing. This closed loop interaction of routing, interconnect extraction and timing/noise analysis helps to drastically reduce the number of iterations of full-chip routing, extraction, and timing and noise analysis, and achieve design closure in a timely manner.

Completely accurate capacitance calculation requires a 3D finite-element or finite-difference calculation: All conductors within a certain volume around the conductor (wire or via) of interest must be considered. Each net is composed of wires and vias. VLSI interconnections run on several layers, and a given net may traverse multiple layers. Wires are the metal interconnection on a single layer, while vias are interconnections between wires on different metal layers.

2D capacitance calculation, as the name implies, assumes that all of the conductors are infinite in one direction, and the interactions are limited to a 2D rectangular region. When wiring is performed in a preferred direction for each plane, and adjacent planes run in orthogonal directions, 2D capacitance calculation for a wire is applied to a plane perpendicular to the preferred direction of the wire. To simplify matters further, the wire is assumed to be bounded by perfect metal planes on the two adjacent layers, and only the nearest neighbors of the wire to the left and right may be considered for capacitance calculation.

The main limitation of the 2D method is the assumption that the wiring planes above and below are solid. In fact, they consist of unevenly spaced orthogonal wires. A better model is to adjust the calculated 2D capacitances, by comparing them to 3D capacitances with the planes above and below replaced by regularly spaced wires of varying periodicity. Then, a simple adjustment can be made to the 2D capacitances by computing an average spacing (by dividing the number of orthogonal wires in an area by the area's width) and shifting the 2D capacitances to match the 3D capacitances when wire above and below have the same periodicity as the average spacing. This is termed 2½D capacitance calculation. It has the advantage that very simple table lookups (for the 2D capacitances) and adjustment coefficients (to convert 2D to 3D capacitances) can be used, along with simple geometry processing (to compute lateral spacings to adjacent wires for 2D table lookup, and average spacing calculation for the wire above and below) to compute the self and coupling capacitances for a wire segment quite accurately.

Of course, the 2½D method works best for long wires, where the wiring is done in a preferred direction on each plane, and the preferred direction alternates between adjacent planes (which is exactly how the present routing program works). Long wires are the ones that are important for global timing and noise optimization, so this method delivers extraction accuracy where required, with the calculation speed necessary for timing and noise optimization.

Figure 3:
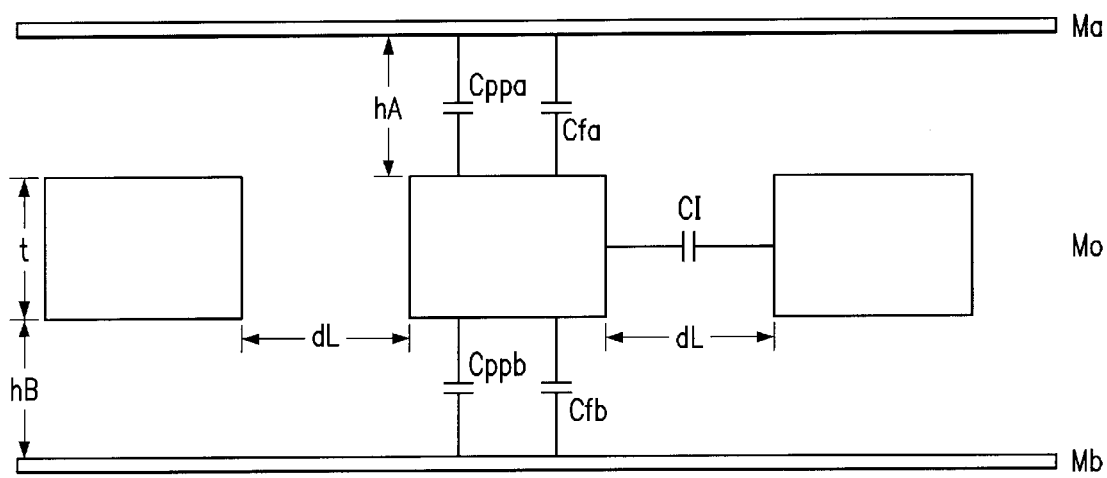
FIG. 3 depicts a schematic diagram illustrating a wire cross-section to which the method of the present invention may be applied.

Referring to FIG. 3, a schematic diagram illustrates a wire cross-section to which the method of the present invention may be applied. FIG. 3 shows the cross-section of a wire on layer Mo, with two neighbors, above on layer Ma and below on layer Mb. This is a typical 2D capacitance calculation scenario. The capacitance values Cl, Cppa, Cppb, Cfa, and Cfb are tabulated by varying dL and different combinations of Mo, Ma, Mb (or t, hA and hB). These capacitance values are then adjusted for average wire density on Ma and Mb to arrive at the 2½D capacitance. The sum of all five capacitances is typically called the self-capacitance of the wire. Cl is termed the coupling capacitance to the adjacent wire.

Figure 4:
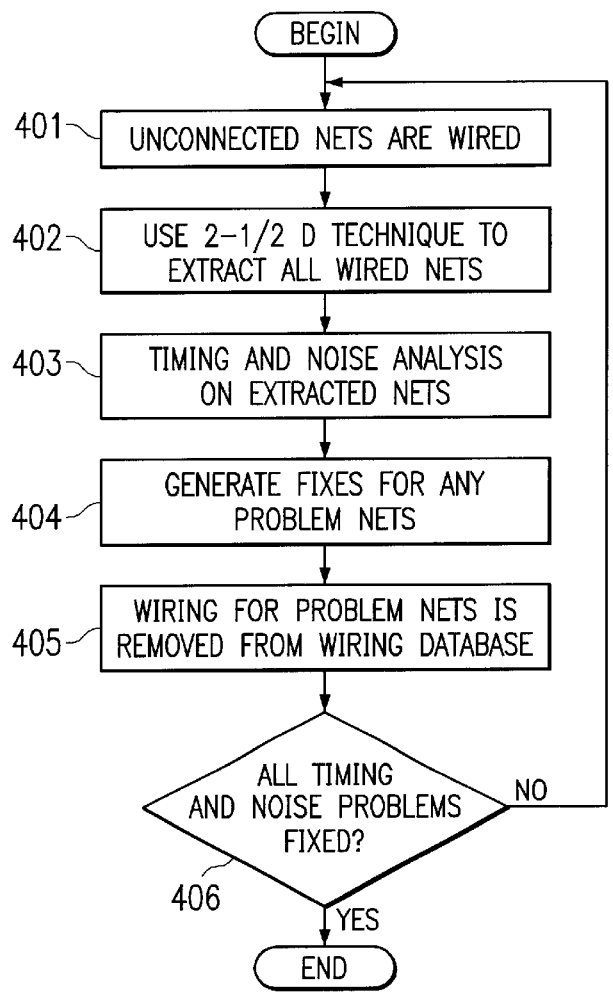
FIG. 4 depicts a flowchart illustrating a wiring-extraction-timing/noise analysis process in accordance with the present invention.

Referring now to FIG. 4, a flowchart illustrating a wiring-extraction-timing/noise analysis process is depicted in accordance with the present invention. After the process is initiated, any unconnected nets in the design are wired (step 401). In the first pass, this would be all the nets in the design.

The main feature of the present invention is a 2½ D coupling capacitance extraction capability built into the detailed router. The data structure of the detailed router (line intervals in the preferred wiring direction on each layer) allows a designer to quickly query the neighbors of any wire, and evaluate the lateral spacing to the neighboring wires. A 2D table lookup (with the lateral spacing information, and the height of the wiring layers above and below) gives the lateral (coupling) and total capacitance of a wire segment. This capacitance can be corrected for the coverage (wire density) on the layers above and below, to obtain an accurate 2½ D capacitance of the wire. This 2½ D extraction technique is used to extract all the nets wired (or rewired) in the current iteration (step 402). The router may have to rip-up and reconnect some existing wires in order to finish the unconnected nets.

The capacitances (coupling capacitance to the neighbor, ground capacitance to the layer above and below) for all the unique couplings of a wire segment are combined with the wire resistance to produce a pi or T model for the wire segment. Pi and T models are electrical equivalent models for a wire segment. A pi model represents the wire as a capacitor-resistor-capacitor triple, where the capacitor may be to ground or another wire. A T model represents the wire as a resistor-capacitor-resistor triple. If the wire segment is too long, it may be broken down into several pi or T models. The segment model is combined with the pi or T models for all other wire segments and vias for a net, to produce a complete interconnect resistance/capacitance (RC) model for a net. This RC model can be used for very accurate timing analysis.

In addition, an ID on the adjacent shape can be stored for each coupling capacitance, which later helps in creating a fully coupled interconnect model for detailed noise analysis of a net and its neighbors. The process of extracting nets is sequential. If a coupling is calculated between a wire and one of it's neighbors, the neighbor may not have its equivalent RC model extracted yet. Somehow, the RC model for both nets needs to have a coupling capacitance established between them. This is done by adding another identifier to each wire, which is carried into the RC network (called a shape ID). Each node in the RC network will have an associated shape ID. Several nodes may have the same shape ID, but each wire has a unique shape ID. During extraction, any coupling capacitance established from a target wire to any other wire will be represented as a capacitance from a node in the target wire's RC network, to a shape ID (corresponding to the wire that the coupling is to) in the adjacent net. After all the nets are extracted, these shape ID's are used to resolve the coupling capacitors to the proper nodes in the adjacent net's RC network.

Timing and noise analysis is then performed on the newly extracted nets (step 403). For any wire segment, an interval data structure is used to break the wire segment into unique coupling elements, where the immediate lateral neighbors on either side of the wire are at the same spacing along the length of the unique coupling element. An interval data structure contains a list of one-dimensional non-overlapping line segments of the form (low, high) over a certain range (LOW, HIGH). This data structure supports fast additions: If a new line segment is added to the list, the list is resolved quickly to include this new line segment, while maintaining all the segments as non-overlapping. When a line segment is added, this operation also returns the length of this new segment which did not overlap any segment previously resident in the interval data structure. Such a data structure is very useful for computing lateral couplings of a target wire. The adjacent channels to the target wire are queried (starting from the closest one) for wires or blockages that overlap the given wire segment. The interval data structure can then quickly resolve what length of such wires/blockages are "visible" from the target wire. In this way, the unique lateral couplings of the target wire can be quickly established.

Fixes are generated for any problem nets (step 404). This is done through optimization programs. The present invention supports several different wire optimizations. One optimization is choosing the correct wire width which is used to reduce the wire delay for critical wires, at the expense of extra wiring resources. Another optimization is wire spacing to reduce coupling capacitance, which in turn reduces coupling noise, again at the expense of wiring resources. Yet a further optimization is net weight. Since wiring is a sequential task, net weights help prioritize critical wires to be routed first, so that they have fewer blockages to avoid from previously routed nets and thus may find their shortest routes. In certain cases, the problems may not be fixable by wiring changes. In such cases, a buffer may need to be added, or the driver size may need to be changed. These are termed netlist changes. In general, such changes cause the router model to be reconfigured. In some simple cases, however, the router model can simply be updated to accommodate the netlist changes.

The existing wiring for the problem nets is then removed from the wiring database (step 405). If there are no remaining timing and noise problems, the process ends. If any timing and noise problems remain, steps 401–405 are repeated until the problems are resolved.

The present technique gives designers the capability of fast and accurate interconnect extraction within the routing tool. In addition, this technique is incremental. Any wiring changes can be quickly re-extracted, since only local information is required for extraction. This incremental capability allows designers to perform quick iterations of wiring, extraction and timing analysis. The wiring tool is incremental in the sense that if a partially wired design is loaded into the wiring tool, it can be instructed to finish the wiring for the unconnected nets. In the absence of accurate extraction built into the routing tool, the designer is forced to externalize the data from the router, and instruct the extraction tool as to which nets have changed in the wiring. Such information is hard to obtain (since the router may rip up several nets which the designer did not intend to change) and even harder to use for incremental extraction.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for timing and noise analysis in designing data processing chips, comprising:
   wiring all unconnected nets in a design;
   using a 2½ D capacitance extraction technique built into a detailed router to extract wired nets;
   analyzing the extracted nets using a timing and noise analysis tool; and
   generating fixes to nets which contribute to timing and noise failures.

2. The method according to claim 1, wherein the step using a 2½ D capacitance extraction technique further comprises determining both coupling and total capacitance of a wire segment, and correcting for wire density on layers above and below the wire segment to determine the 2½ D capacitance of that wire segment.

3. The method according to claim 2, wherein capacitance is determined using a 2D table containing information on lateral spacing between wire segments and a height of wiring layers above and below a wire segment.

4. The method according to claim 1, wherein the step of analyzing further comprises:
   using an interval data structure to break a wire segment into unique coupling elements;
   combining coupling and ground capacitance of each coupling element with a wire resistance to produce a model for that wire segment; and
   combining models for all wire segments in a net to produce an interconnect resistance/capacitance model for the net.

5. The method according to claim 4, further comprising:
   storing an ID on an adjacent shape for each coupling capacitance; and
   using the ID to create an interconnect model for performing detailed noise analysis of a net and its neighbors.

6. The method according to claim 1, wherein the step of generating fixes to nets further comprises:
   picking wire codes for changing wire width and spacing and for shielding; and
   picking net-weights to give priority to keeping wire length as short as possible.

7. The method according to claim 1, wherein the step of generating fixes to nets further comprises buffer insertion and driver re-sizing.

8. A computer program product in a computer readable medium for use in a data processing system, for timing and noise analysis in designing data processing chips, the computer program product comprising:
   instructions for wiring all unconnected nets in a design;
   instructions for using a 2½ D capacitance extraction technique built into a detailed router to extract wired nets;
   instructions for analyzing the extracted nets using a timing and noise analysis tool; and
   instructions for using optimization programs to generate fixes for any nets which contribute to timing and noise failures.

9. The computer program product according to claim 8, wherein the instructions for using a 2½ D capacitance extraction technique further comprises instructions for determining both coupling and total capacitance of a wire segment, and instructions for correcting for wire density on layers above and below the wire segment to determine the 2½ D capacitance of that wire segment.

10. The computer program product according to claim 9, wherein capacitance is determined using a 2D table containing information on lateral spacing between wire segments and a height of wiring layers above and below a wire segment.

11. The computer program product according to claim 8, wherein the instructions for analyzing further comprises:
    instructions for using an interval data structure to break a wire segment into unique coupling elements;
    instructions for combining coupling and ground capacitance of each coupling element with a wire resistance to produce a model for that wire segment; and
    instructions for combining models for all wire segments in a net to produce an interconnect resistance/capacitance model for the net.

12. The computer program product according to claim 11, further comprising:
    instructions for storing an ID on an adjacent shape for each coupling capacitance; and
    instructions for using the ID to create an interconnect model for performing detailed noise analysis of a net and its neighbors.

13. The computer program product according to claim 8, wherein the optimization programs used to generate fixes:
    pick wire codes for changing wire width and spacing and for shielding; and
    pick net-weights to give priority to keeping wire length as short as possible.

14. The computer program product according to claim 8, wherein the instructions for generating fixes to nets further comprise instructions for buffer insertion and driver re-sizing.

15. A system for timing and noise analysis in designing data processing chips, comprising:

means for wiring all unconnected nets in a design;

means for using a 2½ D capacitance extraction technique built into-a detailed router to extract wired nets;

means for analyzing the extracted nets using a timing and noise analysis tool; and means for generating fixes to nets which contribute to timing and noise failures.

16. The system according to claim 15, wherein the means for using a 2½ D capacitance extraction technique further comprises means for determining both coupling and total capacitance of a wire segment, and means for correcting for wire density on layers above and below the wire segment to determine the 2½ D capacitance of that wire segment.

17. The system according to claim 16, wherein capacitance is determined using a 2D table containing information on lateral spacing between wire segments and a height of wiring layers above and below a wire segment.

18. The system according to claim 15, wherein the means for analyzing further comprises:

means for using an interval data structure to break a wire segment into unique coupling elements;

means for combining coupling and ground capacitance of each coupling element with wire resistance to produce a model for that wire segment; and means for combining models for all wire segments in a net to produce an interconnect resistance/capacitance model for the net.

19. The system according to claim 18, further comprising:

means for storing an ID on an adjacent shape for each coupling capacitance; and means for using the ID to create an interconnect model for performing detailed noise analysis of a net and its neighbors.

20. The system according to claim 15, wherein the means for generating fixes further comprises:

means for picking wire codes for changing wire width and spacing and for shielding; and means for picking net-weights to give priority to keeping wire length as short as possible.

21. The system according to claim 15, wherein the means for generating fixes to nets further comprise means for buffer insertion and driver re-sizing.

* * * * *

UNITED STATES PATENT AND TRADEMARK OFFICE
CERTIFICATE OF CORRECTION

PATENT NO. : 6,467,069 B2
DATED : October 15, 2002
INVENTOR(S) : Mehrotra et al.

It is certified that error appears in the above-identified patent and that said Letters Patent is hereby corrected as shown below:

Title page,
Item [74], please delete "O'ttagan" and insert -- O'Hagan --.
Item [57], ABSTRACT,
Line 6, after "then", please delete "process" and insert -- processed --.

Column 8,
Line 51, after "interconnect", please delete ".".

Column 9,
Line 3, after "built", please delete "into-a" and insert -- into a --.

Signed and Sealed this

Sixth Day of May, 2003

JAMES E. ROGAN
*Director of the United States Patent and Trademark Office*